US008198734B2

(12) United States Patent
Anderson et al.

(10) Patent No.: US 8,198,734 B2
(45) Date of Patent: Jun. 12, 2012

(54) SILICON-ON-INSULATOR STRUCTURES FOR THROUGH VIA IN SILICON CARRIERS

(75) Inventors: Brent A. Anderson, Jericho, VT (US); Paul S. Andry, Yorktown Heights, NY (US); Edmund J. Sprogis, Underhill, VT (US); Cornelia K. Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 12/550,494

(22) Filed: Aug. 31, 2009

(65) Prior Publication Data

US 2009/0315188 A1    Dec. 24, 2009

Related U.S. Application Data

(62) Division of application No. 11/751,105, filed on May 21, 2007, now Pat. No. 7,645,701.

(51) Int. Cl.
*H01L 27/12* (2006.01)
*H01L 29/40* (2006.01)
*H01L 23/48* (2006.01)
*H01L 23/52* (2006.01)

(52) U.S. Cl. ........ 257/774; 257/347; 257/621; 257/777; 257/E21.545; 257/E21.597

(58) Field of Classification Search .................. 257/347, 257/621, 774, 777, E21.545, E21.597
See application file for complete search history.

(56) References Cited

U.S. PATENT DOCUMENTS

| 5,666,002 | A | * | 9/1997 | Yamamoto et al. | 257/621 |
| 5,682,062 | A | * | 10/1997 | Gaul | 257/686 |
| 5,998,292 | A | | 12/1999 | Black et al. | 438/618 |
| 6,312,621 | B1 | | 11/2001 | Pedigo et al. | 252/500 |
| 6,770,542 | B2 | | 8/2004 | Plossl et al. | 438/458 |
| 6,888,223 | B2 | | 5/2005 | Brouillette et al. | 257/621 |
| 6,897,125 | B2 | | 5/2005 | Morrow et al. | 438/459 |
| 7,056,813 | B2 | | 6/2006 | Morrow et al. | 438/459 |

(Continued)

FOREIGN PATENT DOCUMENTS

| CN | 200410003636.8 | 2/2003 |
| CN | 1519925 A | 8/2004 |

OTHER PUBLICATIONS

U.S. Appl. No. 11/214,602, filed Aug. 30, 2005, Andry, et al.

(Continued)

*Primary Examiner* — Teresa M Arroyo
(74) *Attorney, Agent, or Firm* — John A. Jordan (57) ABSTRACT

A silicon-on-insulator (SOI) structure is provided for forming through vias in a silicon wafer carrier structure without backside lithography. The SOI structure includes the silicon wafer carrier structure bonded to a silicon substrate structure with a layer of buried oxide and a layer of nitride separating these silicon structures. Vias are formed in the silicon carrier structure and through the oxide layer to the nitride layer and the walls of the via are passivated. The vias are filled with a filler material of either polysilicon or a conductive material. The substrate structure is then etched back to the nitride layer and the nitride layer is etched back to the filler material. Where the filler material is polysilicon, the polysilicon is etched away forming an open via to the top surface of the carrier wafer structure. The via is then backfilled with conductive material.

12 Claims, 6 Drawing Sheets

U.S. PATENT DOCUMENTS

| | | | |
|---|---|---|---|
| 7,074,715 B2 | 7/2006 | Brouillette et al. | 438/637 |
| 7,344,959 B1* | 3/2008 | Pogge et al. | 438/459 |
| 7,605,019 B2* | 10/2009 | Simon et al. | 438/109 |
| 7,645,701 B2* | 1/2010 | Anderson et al. | 438/675 |
| 7,821,120 B2* | 10/2010 | Pogge et al. | 257/698 |
| 2004/0097002 A1* | 5/2004 | Pogge et al. | 438/52 |
| 2004/0251554 A1* | 12/2004 | Masuda | 257/773 |
| 2005/0051883 A1* | 3/2005 | Fukazawa | 257/686 |
| 2005/0110116 A1* | 5/2005 | Ishio et al. | 257/532 |
| 2005/0121768 A1 | 6/2005 | Edelstein et al. | 257/698 |
| 2005/0133930 A1* | 6/2005 | Savastisuk et al. | 257/774 |
| 2006/0027934 A1 | 2/2006 | Edelstein et al. | 257/774 |
| 2006/0151887 A1* | 7/2006 | Oh et al. | 257/774 |
| 2007/0045780 A1* | 3/2007 | Akram et al. | 257/621 |
| 2007/0096329 A1* | 5/2007 | Suzuki et al. | 257/774 |
| 2007/0117348 A1* | 5/2007 | Ramanathan et al. | 438/455 |
| 2009/0200641 A1* | 8/2009 | Hurkx et al. | 257/565 |

OTHER PUBLICATIONS

Y. Bai, et al., entitled "Hybrid CMOS Focal Plane Array with Extended UV and NIR Response for Space Applications", Presented at SPIE's 48th Annual Meteing, Aug. 3-8, 2003, San Diego, California.

L. Kozlowski, et al., entitled "Low-Noise Monolithic and Hybrid CMOS-Based Sensors", Rockwell Scientific, Nov. 5, 2001.

Horbach et al., "Controlled Collapse Chip Connection on Substrate Edge", IBM Technical Disclosure Bulletin, Mar. 1992, pp. 271-274.

\* cited by examiner

SILICON-ON-INSULATOR STRUCTURES FOR THROUGH VIA IN SILICON CARRIERS

This application is a divisional application of U.S. patent application Ser. No. 11/751,105, filed May 21, 2007, allowed Aug. 21, 2009 now U.S. Pat. No. 7,645,701.

BACKGROUND OF THE INVENTION

1. Field of the Invention

The present invention relates to electrically interconnecting via structures and methods of making same in material, such as, semiconductor material. More particularly, the present invention relates to conductive through via structures and processes for making same in electronic device structures, such as in semiconductor wafers, semiconductor chips, components and the like, and in electronic device carriers for such semiconductor wafers, chips, components, and the like.

2. Background and Related Art

In the packaging of electronic devices, such as, semiconductor chips or wafers, device carriers may be used to interconnect the devices. Where electronic devices are connected to another level of packaging, the carriers typically require conductive vias extending through the carrier to connect the devices to the next level of packaging.

Electronic device carriers may be fabricated from a variety of different materials, such as, glass, ceramic, organic and semiconductor materials or combinations of these and other materials in single or multiple layers.

Electronic device carriers made of semiconductor material, such as, silicon, offer a number of advantages in packaging, such as, ease of manufacturing and reliability and high connection density One of the challenges with this technology is the requirement for complex processing to be carried out on the backside of the wafer. Conventional complex processing steps involving lithography, RIE etching and the like may become much more difficult and costly when carried out on the backside of a semiconductor carrier, such as, silicon.

One prior art approach to creating conductive vias in semiconductor carriers, such as silicon, use what might be called a "via first" approach. The general steps in such an approach are etching the vias, forming insulation layers on the via walls and metallization. When a "blind via" approach is used, the vias are not etched through the wafer layer so that a "through via" is rendered only after the carrier is suitably thinned to expose the via bottoms. An example of such an approach may be seen in U.S. Pat. No. 5,998,292.

There are, however, a number of difficulties with this type of approach. For example, one difficulty is controlling vertical structure dimensions. Another difficulty is controlling the backside thinning depth stop and isolation of the process steps.

Some approaches to creating through vias in semiconductor carriers may require backside lithographic processing and etching steps. Such processing on the backside of a silicon carrier, adds to processing complexity. As an example, U.S. application Ser. No. 11/214,602 filed Aug. 30, 2005, and assigned to the assignee of the present invention, uses photolithography and RIE processing steps on the backside of a silicon wafer in forming through vias in the wafer.

SUMMARY OF THE PRESENT INVENTION

It is an object of the present invention to provide an improved electronic structure and method for fabricating same.

It is a further object of the present invention to provide an improved method of making conductive via structures for electronic packaging.

It is yet a further object of the present invention to provide a through via structure and improved method for making same that simplifies fabrication and improves yield and reliability of packaged electronic devices.

It is yet still a further object of the present invention to provide an improved through via structure and method of making same which readily allows vias to be fabricated of different diameters of uniform depth on a single electronic structure, such as, a chip carrier structure.

It is yet another object of the present invention to provide an improved through via structure and method of making which decouples the via metallization process step from the frontside back-end-of-line (BEOL) metallization process.

It is still yet another object of the present invention to provide a process for fabrication of through conductive via structures in a silicon carrier using a silicon-on-insulator (SOI) wafer structure that provides controlled depth stop and isolation, and simplifies backside processing and in which all structures are self-aligned and structure vertical dimensions tightly controlled.

These, as well as other objects, are achieved in the present invention by forming conductive through vias using a pair of semiconductor structures bonded together through at least two layers of insulation to form a buried insulation structure. More particularly, the method of the present invention comprises the steps of:

providing a semiconductor structure including a first layer of semiconductor material having first and second surfaces and second a layer of semiconductor material having first and second surfaces joined together by a first layer of insulating material and a second layer of insulating material with said first layer of insulating material interposed between said second layer of insulating material and the said second surface of said first layer of semiconductor material and said second layer of insulating material interposed between said first layer of insulating material and the said second surface of said second layer of semiconductor material;

forming a via in said first layer of semiconductor material having a wall surface extending from the said first surface of said first layer of semiconductor material through said first layer of insulating material to said second layer of insulating material;

forming a layer of insulating material on the said wall surface of said via;

filling said via with another material;

etching said second layer of semiconductor material back to said second layer of insulating material; and etching said second layer of insulating material to expose said another material.

As further provided by the present invention, wherein said layer of insulating material on said wall surface of said via is made of the same insulating material as said first layer of insulating material.

As still further provided by the present invention wherein said first layer of semiconductor material and said second layer of semiconductor material are both silicon.

As yet still further provided by the present invention, the step of providing conductive wiring material on said another material.

As still further provided by the present invention, wherein said another material is a conductive material.

As yet further provided by the present invention wherein said another material is polysilicon.

As still further provided by the present invention, the method includes the steps of;

providing an SOI wafer structure including at least a first layer of insulating material and a second layer of insulating material formed between a silicon wafer and silicon substrate with said first layer on insulating material in contact with said silicon wafer;

etching a via from the top surface of said silicon wafer through to said first insulating layer;

etching through said first layer of insulating material;

forming an insulating layer on the sidewalls of said etched via made of the same material as said first layer of insulating material;

filling said via with polysilicon material and planarizing to said top surface of said silicon wafer;

forming conductive metallurgy over said polysilicon material; and then removing by etching said silicon substrate; then removing by etching said second layer of insulating material; then removing by etching said polysilicon material to again form an open via; and forming conductive material in said via to connect to said conductive metallurgy.

As also provided by the present invention, an electrical contact, such as, a solder bump, is formed in contact with said conductive material in said via.

As further provided by the present invention, internal wiring channels are formed between conductive vias in accordance with the process SOI steps described.

In one embodiment of the present invention, a SOI structure is provided having a silicon substrate with a nitride layer formed thereon. An oxide layer is formed on the nitride layer and a silicon carrier wafer is attached to said oxide layer. The walls of a via, formed through the silicon carrier wafer and the buried oxide layer to the nitride layer, are oxidized and back filled with another material. Metallurgy is then formed over said another material.

In another embodiment of the present invention, the above silicon substrate is removed leaving said nitride layer. The nitride layer is then removed leaving said another material. Removal of said another material forms an open via to said metallurgy. Conductive material, back filled into the via, provides electrical connection to said metallurgy. A solder bump is formed in contact with the conductive material formed in the via to permit, for example, connection to a substrate. The thus formed wafer provides a relatively thick silicon carrier.

In another embodiment, the above back filled another material is conductive material thereby providing electrical connection to said metallurgy without the need for backside via etching and backfilling with a conductive material.

In a further embodiment of the present invention, the silicon carrier wafer backside is provided with backside wiring.

In yet still a further embodiment of the present invention, the vias are first created in the silicon carrier wafer from the backside and filled with polysilicon prior to bonding to the silicon substrate.

In another embodiment of the present invention, the silicon carrier wafer is provided with internal wiring channels interconnecting conductive vias.

BRIEF DESCRIPTION OF THE DRAWING

FIGS. 1A-1K show a series of process steps for fabricating a carrier structure, in accordance with one embodiment of the invention.

FIGS. 2A-2L show a series of process steps for fabricating a carrier structure, in accordance with another embodiment of the present invention.

DETAILED DESCRIPTION OF THE DRAWINGS

In accordance with the present invention, conductive through vias in electronic device structures, such as, semiconductor wafer and chip structures and the like, and in electronic device carriers for same are provided by using semiconductor-on-insulator arrangements. As more particularly described, silicon-on-insulator (SOI) structures may be used. Multilayer SOI insulator structures are used to provide a backside lithography-free process for forming vias and channels in a silicon wafer. The SOI wafer structure process provides for controlled depth stop and isolation in through via formation and simplifies backside processing, as may be employed, for example, in silicon carrier technology.

Although description of the via structure and method for fabricating same are described in the following embodiments in terms of electronic device silicon carrier structures, it should be understood that the via structure and method for fabricating same may also be formed in other electronic structures, such as, active device chip and wafer structures. For example, the via structure and method for fabricating same may be used in device stacking, such as, wafer-to-wafer stacking and chip-to-chip stacking. It is readily apparent that the via structure and process of making same defined by the present invention may be employed in any of a variety of electronic device structures, such as, image sensors with backside contact requirements. Although reference is made to silicon structures, it is also readily apparent that structures of other semiconductor material may also be used.

Figure 1A:
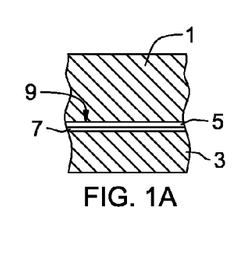
Figure 1B:
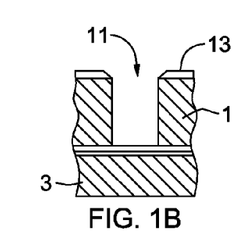
Figure 1C:
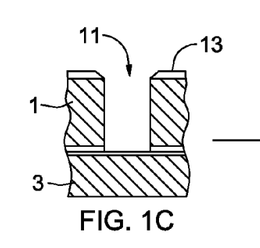
Figure 1D:
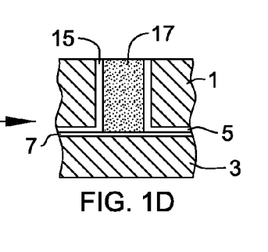
Figure 1E:
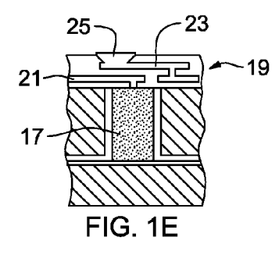
Figure 1F:
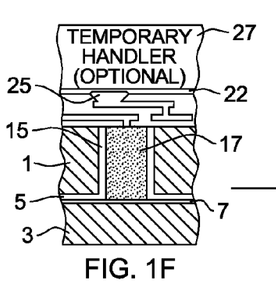
Figure 1G:
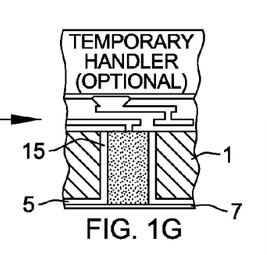
Figure 1H:
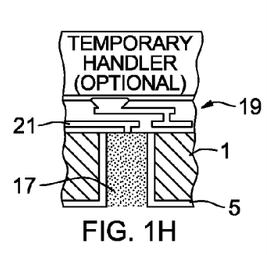
Figure 1I:
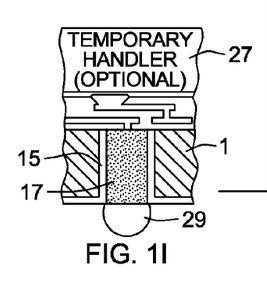
Figure 1J:
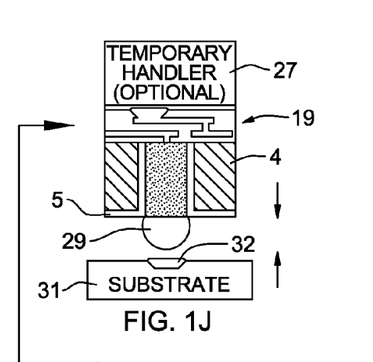

With reference to FIGS. 1A-1K there is shown a series of cross-sectional views of a portion of a silicon carrier wafer which views depict a process for fabricating a conductive through via structure in such carrier, in accordance with one embodiment of the present invention. The cross-sectional views of a portion of a silicon carrier wafer, as shown in FIGS. 1A to 1I, demonstrate how one through via may be fabricated. FIGS. 1J and K show cross-sectional views of the via in a silicon die diced from the silicon carrier wafer. It is clear that a plurality of such vias may simultaneously be fabricated in a silicon wafer carrier or die, for example, using such process.

In the presently preferred embodiment, the carrier is a silicon wafer and the insulators are oxide and nitride. However, other insulators may also be used. With reference to FIG. 1A, there is shown silicon carrier wafer 1 on silicon substrate 3 with buried oxide layer 5 and nitride layer 7 positioned therebetween. Typically, oxide layer 5 would be 0.5 to 1.0 µm thick and nitride layer 7 would be around 0.1 µm thick. Nitride layer 7 may be deposited by any of a variety of well known techniques, such as, CVD. Similarly, oxide layer 5 may be formed by any of a variety of well known techniques, such as, thermal oxidation or plasma enhanced CVD. In this regard, a portion of oxide layer 5 may first be deposited upon the joining side 9 of silicon wafer 1 and another portion on nitride layer 7 and then wafer 1 would be bonded to substrate 3 by fusing the oxide layers together with heat. It is clear, that other techniques could as readily be employed to bond the structures together.

After forming the multilayer SOI structure shown in FIG. 1A, a via 11 is formed in silicon wafer 1 down to oxide layer 5. This is done by patterning photoresist layer 13 to form an opening corresponding to the desired opening size of the via and etching the silicon through the opening to oxide layer 5 using, for example, a deep reactive ion etch (RIE) method. Thus, deep silicon etching by fluorine radicals generated in a plasma, as is known in the art, may be employed. Such deep silicon structures may be fabricated using conventional available deep RIE systems, such as the A 601E, available from Alcatel. In this regard, it is noted that, in accordance with the process of the present invention, silicon carrier 1 may be, for example, a 200 mm wafer 50 µm thick.

After etching via 11, the exposed oxide of oxide layer 5 in the bottom of the via is removed stopping at nitride layer 7. This oxide may be removed by etching, for example, with HF. This is shown in FIG. 1C.

As shown in FIG. 1D, resist layer 13 is then stripped using conventional resist removing technique. As also shown in FIG. 1D, the sidewalls of via 11 are then passivated to form, for example, a layer 15 of oxide 1 µm thick using thermal oxidation. Other oxide thicknesses are also possible. This may be carried out, for example, in a tube furnace in an oxygen or steam environment between 900° C. and 1100° C. Via 11 is then filled with a conductive material 17. The conductive material may be plated copper or tungsten, for example. After filling the via with a conductive material, the material is planarized by chemical-mechanical polishing (CMP), for example, back to the top surface of silicon carrier 1.

As shown in FIG. 1E, the next step involves conventional silicon processing steps ending with back-end-of-line (BEOL) wiring and bond pad structures 19. Two wiring levels are shown by way of example, with wiring level 21 connected to conductive material 17 and wiring level 23 connected to pad 25. Techniques for forming such wiring and bond pad structures are well known in the art. In this regard, the term "metallurgy" is used to cover broadly conductive wiring and/or bond pad and interconnection structures similar to structures 19.

For convenience in handling, a temporary handling structure 27 may be attached to the wiring and bond pad structure 19, as shown in FIG. 1F. This handling structure may be, for example, a glass wafer bonded to the wiring and bond pad structure 19 using an adhesive 22.

As shown in FIG. 1G, the next step involves removing the silicon of silicon substrate 3 from the backside of the SOI structure. This removal process may be accomplished by, for example, grinding and/or TMAH etch down to nitride layer 7 with latter being the etch stop.

The next step involve removal of the buried nitride layer 7 from the backside, as shown in FIG. 1H. This may be accomplished by reactive ion etching (RIE), for example. Wet etches may also be used. At this point, conductor 17 in via 11, which is in contact with wiring 21, is exposed.

As shown in FIG. 1I, a solder bump 29 may now be deposited over the conductive through via in contact with conductive material 17. A typical process for depositing solder bump 29 is the well known C4 process.

Wafer 1 may then be diced into individual die carriers 4 and flip chip joined to contact 32 on substrate 31, as shown in FIG. 1J. The temporary glass handler 27 is then removed by laser ablation, as shown in FIG. 1K. It is clear that other glass handler release systems could be employed, such as, glass handlers with an array of through holes which allow a chemical solvent to flow through the holes to remove the bonding adhesive. After removal of the glass handler, a cleaning step is employed to remove the residual polymer on the top surface of the through via die.

In the process depicted in FIG. 1, it is noted that the etched via 11 was filled with a conductor 17 from the front side of the multilayer SOI insulator structure. The process depicted in FIG. 2 shows an alternative arrangement wherein the etched via 11 is filled from the front side with a non-conductor, such as, polysilicon, the latter being a convenient silicon process material. In such an arrangement, the polysilicon is then removed from the SOI structure from the backside and the opened via is then filled with a conductive material. Accordingly, formation of the conductive via in this arrangement is isolated from and independent of the BEOL metallization process and front-end process steps on the front side of the wafer. Thus, a particular advantage of using this process flow is that additional front-end process steps, such as, building transistor devices, resistors, capacitors, etc., can be carried out on the carrier since a polysilicon filled via can still be processed through front-end steps, while a metal filled via in such circumstances, typically, cannot.

Thus, in the process arrangement of FIG. 2, FIGS. 2A-2C are the same as previously described with respect to FIG. 1. In this regard, like reference characters have been used in the various figures to identify like elements. In FIG. 2D, the deep via resist 13 has been stripped and the sidewalls passivated, as described above with respect to FIG. 1D. However, at this point via 11 is filled with polysilicon 33. This may be done, for example, by CVD. After CVD of the polysilicon, etching or CMP of the overburden material is undertaken to planarize the surface to the silicon wafer surface.

Figure 2A:
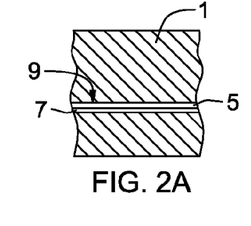
Figure 2B:
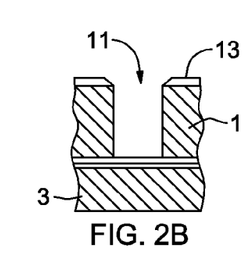
Figure 2C:
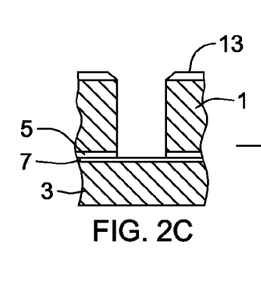
Figure 2G:
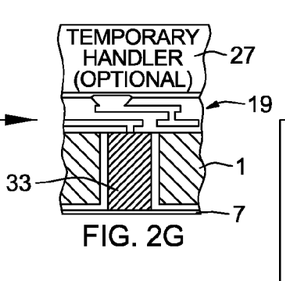

Conventional silicon processing steps are then undertaken to add front end devices and BEOL wiring and bond pad structures, as shown in FIG. 2E. The structure and steps shown in FIGS. 2E-2G are the same as shown and described with respect to FIGS. 1E-1G.

Figure 2H:
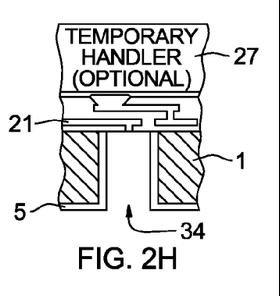

As shown in FIG. 2H, nitride layer 7 is again stripped by RIE to the buried etch stop oxide layer 5. At this point, the polysilicon filler plug 33 in via 11 is exposed. The polysilicon filler is then removed using, for example, an etchant, such as, TMAH, leaving an open via 34 to the wiring 21 on the topside wiring and bond pad structure 19.

Figure 2I:
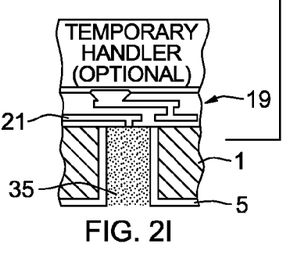

The open via 34 is then filled with a conductive material, such as copper, to form conductive via 35, as shown in FIG. 2I. The copper may be plated, for example, and then planarized by CMP.

Figure 2J:
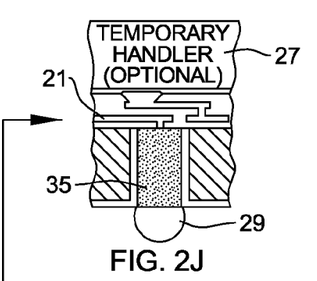
Figure 2K:
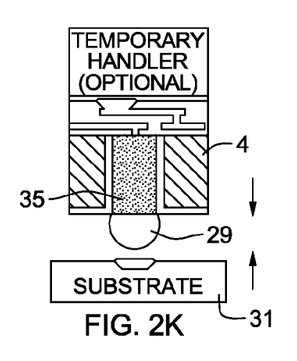
Figure 2L:
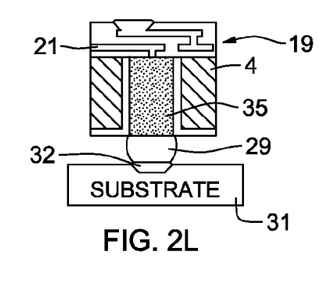

The remaining steps shown in FIGS. 2J-2L are the same as described and shown with respect to FIGS. 1I-1K above. Thus, FIG. 2 includes, the additional steps of removing the polysilicon filler plug and backfilling with a conductive material from the silicon carrier wafer backside, as shown in FIGS. 2H and 2I.

The process depicted in FIG. 3 adds an additional wiring layer on the backside of wafer 1, again, without using backside lithography. In such an arrangement, silicon substrate 3 is first patterned with features on at least one side before silicon wafer 1 is bonded thereto. In the arrangement of FIG. 3, features are first patterned in the bonding side of silicon substrate 3 before bonding.

Figure 3A:
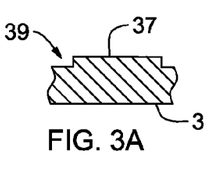
FIGS. 3A-3O show a series of process steps for fabricating carrier structure, in accordance with yet another embodiment of the present invention.
Figure 3B:
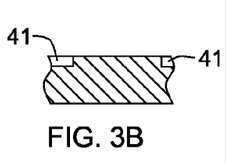
Figure 3C:
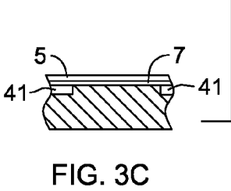
Figure 3D:
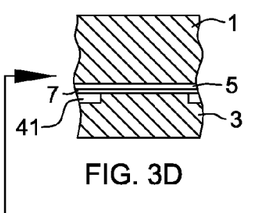
Figure 3E:
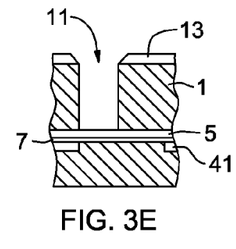
Figure 3F:
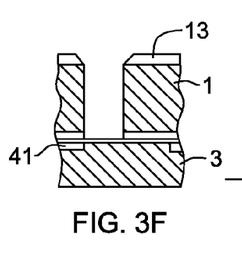
Figure 3G:
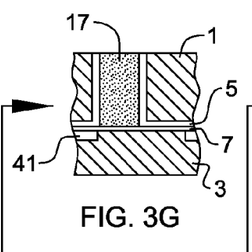
Figure 3H:
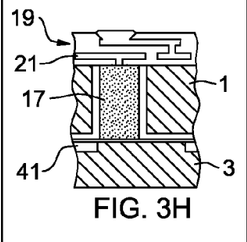
Figure 3I:
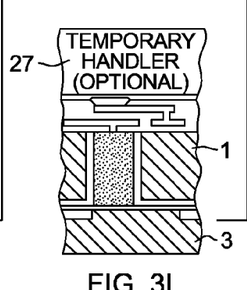

Thus, as shown in FIG. 3A, the bonding side 37 of silicon substrate 3 is etched using RIE for TMAH, for example, to form patterned recess 39. Typically, the recess would be around 0.5 µm. In FIG. 3B, the recessed regions 39 are filled with an oxide 41 and planarized using, for example, processes described above. After planarizing oxide 41, blanket nitride layer 7 and a portion of the thickness of oxide layer 5 are deposited over the silicon substrate surface and recessed oxide 41, as shown in FIG. 3C. Wafer 1 with blanket oxide on its joining side is then bonded to the thus formed oxide surface of bonding side 37 of substrate 3, as shown in FIG. 3D, in a manner as described with respect to FIG. 1A. The bonding step thus forms buried oxide layer 5 and nitride layer 7 of the SOI structure.

Figure 3J:
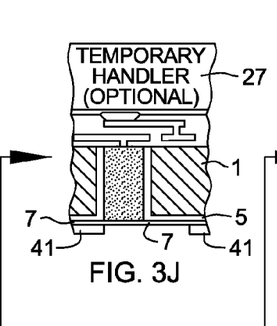

The structure and steps shown in FIGS. 3E-3I are the same as those shown and described in FIGS. 1B-1F. However, as shown in FIG. 3J, the silicon material of silicon substrate 3 is etched back to expose nitride layer 7 leaving recessed oxide 41. A recess 43 is thus formed for a wiring channel. Etches highly selective to silicon, such as, RIE or plasma etching using well known gases, such as, $CF_4$, $SF_6$, $NF_3$, and the like, may be used for this purpose.

Figure 3K:
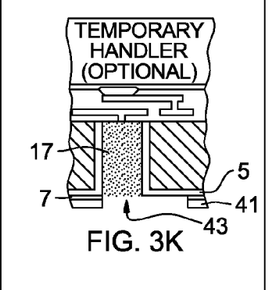
Figure 3L:
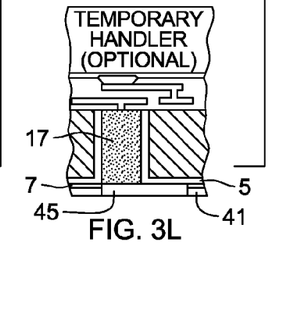

As shown in FIG. 3K, the exposed nitride is etched by RIE, for example, leaving recess region 43 between oxide pattern 41. Recess region 43 thus forms a channel that may be used for wiring. As shown in FIG. 3L, the wiring channel region 43 is filled with a conductive material 45, such as, copper. The copper may, for example, be plated into the channel region and then planarized.

Figure 3M:
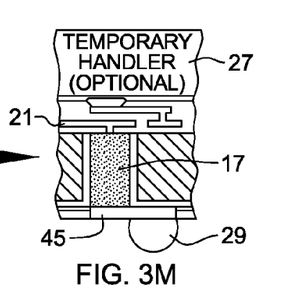
Figure 3N:
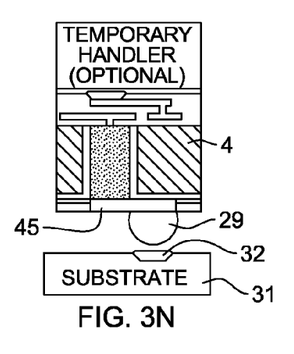
Figure 3O:
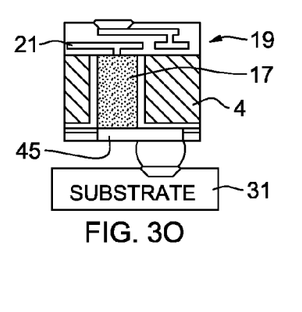

This backside wiring may be used in a variety of ways, such as, interconnecting conductive vias. In FIG. 3M, wiring 45 is used to connect conductive via 17 to solder bump 29, as offset from the conductive via. The structure and steps shown in FIGS. 3N and O are the same as those described with respect to FIGS. 1J and K wherein the silicon wafer 1 is diced and flip chip joined to substrate 31. The temporary glass handler 27 is then removed by laser ablation.

Figure 4A:
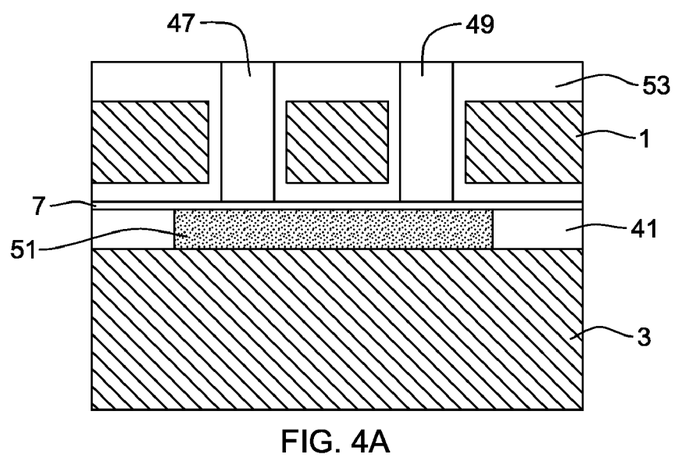
FIGS. 4A-4C show a series of process steps for fabricating yet another carrier structure, in accordance with yet still another embodiment of the present invention.

FIG. 4 shows additional embodiments using sequence steps, as described above. In FIG. 4A, before joining to silicon carrier wafer 1, silicon substrate 3 is patterned with oxide 41 as described in FIG. 3. The silicon between patterned oxide 41 is then removed by etching and backfilled with polysilicon 51. The thus formed silicon substrate is then bonded to silicon carrier wafer 1, as previously described, and a pair of via conductors 47 and 49 are formed in a manner as described with respect to FIG. 1. The conductors 47 and 49 may, again, be copper or tungsten. Although a top oxide 53 is shown, the arrangement could be implemented without it.

Figure 4B:
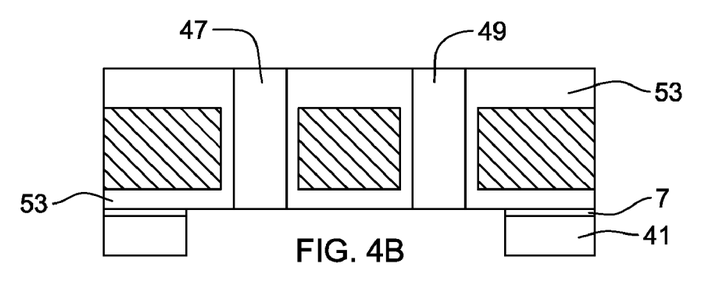
Figure 4C:
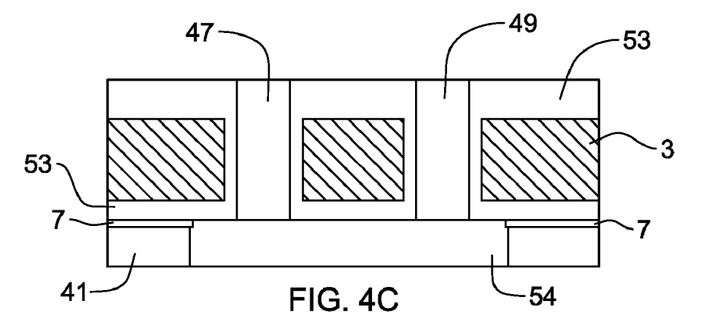

In FIG. 4B, silicon substrate 3 has been etched back first, leaving patterned oxide 41 and polysilicon layer 51 on nitride layer 7. Then, polysilicon layer 51 and nitride layer 7 are etched back to form a recess in the buried oxide 41 which recess may be used to form wiring. In FIG. 4C, conductive material 54 has been deposited to form a wire conductor between conductive vias 47 and 49. It is clear that other wiring channels could, similarly, be formed.

FIG. 5 shows a further embodiment of the present invention. In this embodiment, before silicon wafer 1 is bonded to silicon substrate 3, a pair of vias are etched from the backside of carrier wafer 1, in a manner similar to that described above with respect to etching vias from the topside. The vias are then filed with polysilicon to form polysilicon plugs 55 and 56 in a manner as described above, and the resulting structure is bonded to silicon substrate 3 with buried oxide layer 5 and nitride layer 7 joined, as previously described.

The silicon material of silicon substrate 3 is then etched back to nitride layer 7, and nitride layer 7 is, in turn, etched back to expose polysilicon plugs 55 and 56, in a manner as described above. The silicon plugs 55 and 56 are then etched out of the vias, as shown in FIG. 5B. As also shown in FIG. 5B, the opened vias may then be filled or lined with a conductive material 62 and conductive vias 57 and 59 formed through top oxide layer 61.

Figure 5A:
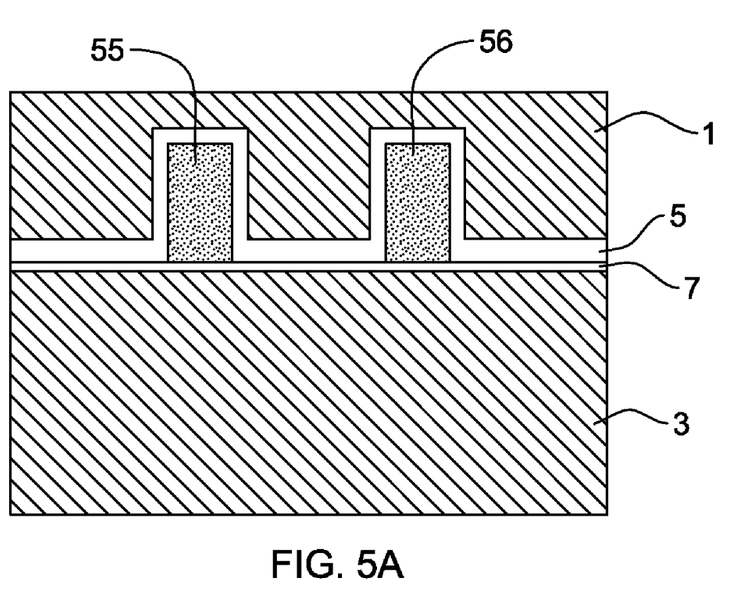
FIGS. 5A-5B show further process steps for fabricating a carrier structure, in accordance a further embodiment of the present invention.
Figure 5B:
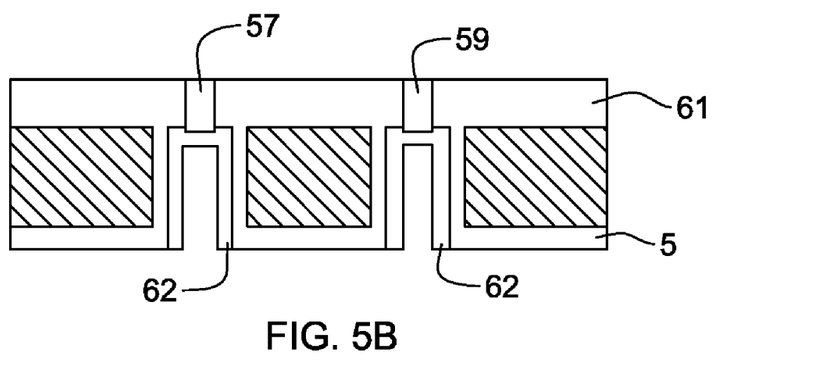
Figure 6A:
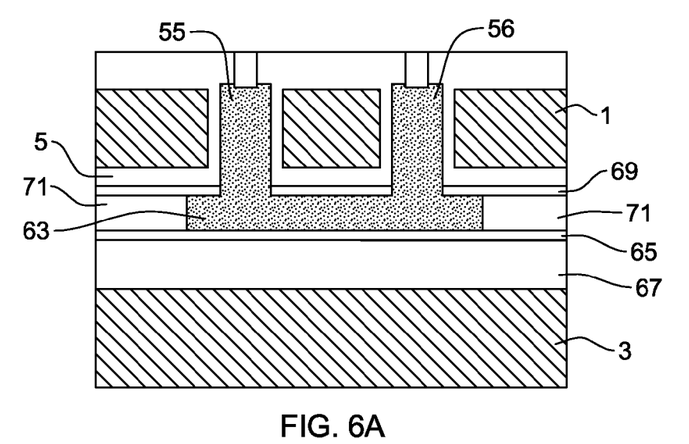
FIGS. 6A-6C show steps for fabricating a carrier structure, in accordance with yet a further embodiment of the present invention.

FIG. 6 shows a combination of the structures shown in FIGS. 4 and 5. FIG. 6A shows a structure similar to FIG. 4A except for the fact that the polysilicon 51, shown in FIG. 4A, extends up into the vias (like FIG. 5A) where conductors 47 and 49 are shown, to thereby form polysilicon region 63.

This may be accomplished by forming insulating layer 67 on substrate 3, then nitride layer 65 on insulating layer 67 and then insulating layer 71 on nitride layer 65, as shown in FIG. 6A, all before joining substrate 3 to carrier wafer 1. Lithography is then used to a pattern an opening in insulating layer 71 and the opening is backfilled with polysilicon 63. Polysilicon is also separately backfilled into vias in silicon carrier 1 through a patterned nitride layer 69, similar to the process employed in FIG. 5, to thereby form polysilicon regions 55 and 56. Substrate 3, thus formed, is then bonded to carrier 1, thus formed.

Figure 6B:
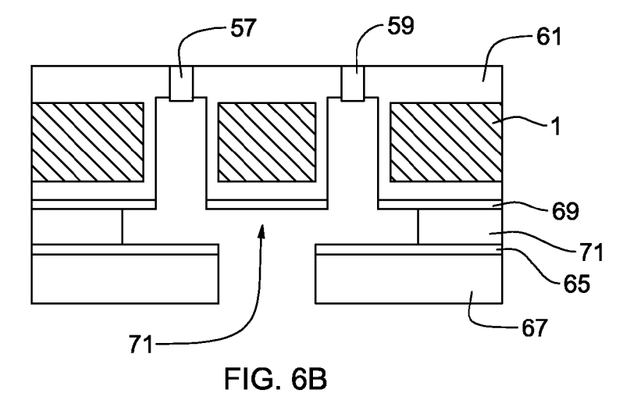
Figure 6C:
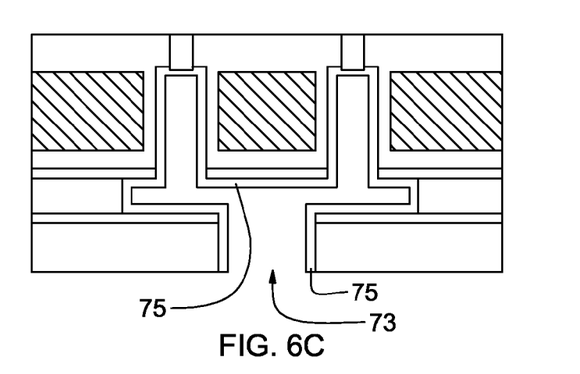

Etching is then carried out, as previously described, to produce vias that open to a common channel region 71, as shown in FIG. 6B. As shown in FIG. 6C, the vias, channel region and common port 73 may then be plated with a conductive material 75.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:
1. An electronic structure, comprising:
a semiconductor structure including a first layer of semiconductor material having first and second surfaces and a second layer of semiconductor material having first and second surfaces joined together by a first layer of insulating material having first and second surfaces and a second layer of a different insulating material having first and second surfaces with the first surface of said first layer of insulating material in contact with the first surface of said second layer of insulating material and the second surface in contact with said second surface of said first layer of semiconductor material and with the first surface of said second layer of insulating material in contact with the first surface of said first layer of insulating material and the second surface in contact with the second surface of said second layer of semiconductor material;
at least one via in said first layer of semiconductor material having a wall surface extending from said first surface of said first layer of semiconductor material through said first layer of semiconductor material and said first layer of insulating material to the first surface of said second layer of insulating material;
a layer of insulating material covering said wall surface of said at least one via made of the same material as said first layer of insulating material and extending to the first surface of said second layer of insulating material; and
a filler material filling said at least one via so as to be coplanar with said first surface of said first layer of semiconductor material and extending to the first surface of said second layer of insulating material.

2. The electronic structure as set forth in claim 1 wherein said filler material is conductive material.

3. The electronic structure as set forth in claim 2 wherein metallurgy is positioned on said first surface of said first layer of semiconductor material including said conductive material.

4. The electronic structure as set forth in claim 3, further including a solder bump positioned on said conductive material exposed at the first surface of said first layer of insulating material having a second surface in contact with the second surface of said first layer of semiconductor material.

5. An electronic structure, comprising:
a semiconductor structure including a first layer of semiconductor material having first and second surfaces and a second layer of semiconductor material having first and second surfaces joined together by a first layer of insulating material having first and second surfaces and a second layer of a different insulating material having first and second surfaces with the first surface of said first layer of insulating material in contact with the first surface of said second layer of insulating material and the second surface in contact with said second surface of said first layer of semiconductor material and with the first surface of said second layer of insulating material in contact with the first surface of said first layer of insulating material and the second surface in contact with the second surface of said second layer of semiconductor material;
at least one via in said first layer of semiconductor material having a wall surface extending from said first surface of said first layer of semiconductor material through said first layer of semiconductor material and said first layer of insulating material to the first surface of said second layer of insulating material;
a layer of insulating material covering said wall surface of said at least one via made of the same material as said first layer of insulating material and extending to the first surface of said second layer of insulating material;
a conductive filler material filling said at least one via so as to be coplanar with said first surface of said first layer of semiconductor material and extending to the first surface of said second layer of insulating material;
metallurgy positioned on said first surface of said first layer of semiconductor material including said conductive material;
a solder bump positioned on said conductive material exposed at the first surface of said first layer of insulating material having a second surface in contact with the second surface of said first layer of semiconductor material; and
a pattern of recessed insulating material coplanar with said second surface of said second layer of semiconductor material and in contact with the second surface of said second layer of insulating material.

6. The electronic structure of claim 5 wherein a layer of metallurgy is positioned on said conductive material exposed at the first surface of said first layer of insulating material within said pattern of recessed insulating material and said solder bump is positioned on said layer of metallurgy.

7. The electronic structure of claim 5 wherein said at least one via includes at least two vias with a conductive filler material filling said at least two vias so as to be coplanar with said first surface of said first layer of semiconductor material and wherein a layer of metallurgy is positioned on said conductive filler material of said at least two vias exposed at the first surface of said first layer of insulating material within said pattern of recessed insulating material.

8. An electronic structure, comprising:
a semiconductor structure including a first layer of semiconductor material having first and second surfaces and a second layer of semiconductor material having first and second surfaces joined together by a first layer of insulating material having first and second surfaces and a second layer of a different insulating material having first and second surfaces with the first surface of said first layer of insulating material in contact with the first surface of said second layer of insulating material and the second surface in contact with said second surface of said first layer of semiconductor material and with the first surface of said second layer of insulating material in contact with the first surface of said first layer of insulating material and the second surface in contact with the second surface of said second layer of semiconductor material;
at least one via in said first layer of semiconductor material having a wall surface extending from said first surface of said first layer of semiconductor material through said first layer of semiconductor material and said first layer of insulating material to the first surface of said second layer of insulating material;
a layer of insulating material covering said wall surface of said at least one via made of the same material as said first layer of insulating material and extending to the first surface of said second layer of insulating material;
a filler material filling said at least one via so as to be coplanar with said first surface of said first layer of semiconductor material and extending to the first surface of said second layer of insulating material; and
a pattern of recessed insulating material in said second layer of semiconductor material coplanar with the second surface of said second layer of semiconductor material and in contact with the second surface of said second layer of insulating material around said at least one via.

9. The electronic structure as set forth in claim 8 wherein said filler material is conductive material.

10. The electronic structure as set forth in claim 9 wherein metallurgy is positioned on said first surface of said first layer of semiconductor material including said conductive material.

11. The electronic structure of claim 10 wherein a layer of metallurgy is positioned on said conductive material exposed at the first surface of said first layer of insulating material within said pattern of recessed insulating material and a solder bump is positioned on said layer of metallurgy.

12. The electronic structure of claim 11 wherein said at least one via includes at least two vias with a conductive filler material filling said at least two vias so as to be coplanar with said first surface of said first layer of semiconductor material and wherein said layer of metallurgy is positioned on said conductive filler material of said at least two vias exposed at the first surface of said first layer of insulating material within said pattern of recessed insulating material.

* * * * *